(12) United States Patent
Qiu

(10) Patent No.: US 8,161,446 B2
(45) Date of Patent: Apr. 17, 2012

(54) SYSTEM AND METHOD OF CONNECTING A MACRO CELL TO A SYSTEM POWER SUPPLY

(75) Inventor: Li Qiu, Pal Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 713 days.

(21) Appl. No.: 12/235,648

(22) Filed: Sep. 23, 2008

(65) Prior Publication Data

US 2010/0077370 A1    Mar. 25, 2010

(51) Int. Cl.
*G06F 17/50* (2006.01)
(52) U.S. Cl. ........ 716/130; 716/126; 716/127; 716/128; 716/129
(58) Field of Classification Search ........... 716/126–130
See application file for complete search history.

(56) References Cited

U.S. PATENT DOCUMENTS

| | | | |
|---|---|---|---|
| 5,331,572 A * | 7/1994 | Takahashi | 257/666 |
| 5,757,089 A | 5/1998 | Ishizuka | |
| 5,972,740 A | 10/1999 | Nakamori | |
| 6,487,706 B1 * | 11/2002 | Barkley et al. | 716/112 |
| 6,657,307 B2 | 12/2003 | Iwamoto | |
| 6,675,367 B1 | 1/2004 | Torii | |
| 6,763,511 B2 * | 7/2004 | Banno et al. | 257/207 |
| 6,925,627 B1 * | 8/2005 | Longway et al. | 257/207 |
| 6,948,148 B2 | 9/2005 | Meier et al. | |
| 7,216,325 B2 * | 5/2007 | Ohshige | 716/126 |
| 7,219,324 B1 | 5/2007 | Sherlekar et al. | |
| 7,786,566 B2 * | 8/2010 | Tomotani | 257/691 |
| 2001/0042238 A1 * | 11/2001 | Ishikawa | 716/10 |
| 2005/0039153 A1 * | 2/2005 | Bednar et al. | 716/12 |
| 2005/0081176 A1 * | 4/2005 | Ohshige | 716/13 |
| 2005/0120322 A1 * | 6/2005 | Chen et al. | 716/13 |
| 2006/0053399 A1 * | 3/2006 | Honda et al. | 716/11 |
| 2006/0085778 A1 * | 4/2006 | Keinert et al. | 716/9 |
| 2006/0175637 A1 | 8/2006 | Lee | |
| 2006/0248492 A1 * | 11/2006 | Hetzel | 716/14 |
| 2007/0124715 A1 * | 5/2007 | Fujiyama et al. | 716/10 |
| 2007/0136715 A1 * | 6/2007 | Ishikawa | 716/17 |
| 2007/0256044 A1 * | 11/2007 | Coryer et al. | 716/13 |
| 2008/0066026 A1 | 3/2008 | Tai et al. | |
| 2008/0073673 A1 * | 3/2008 | Shiga | 257/211 |

FOREIGN PATENT DOCUMENTS

| | | |
|---|---|---|
| JP | 3217045 A | 9/1991 |
| JP | 8147341 A | 6/1996 |
| JP | 2003058592 A | 2/2003 |
| JP | 2007156985 A | 6/2007 |
| WO | WO2006100795 A1 | 9/2006 |

OTHER PUBLICATIONS

International Search Report and Written Opinion—PCT/US2009/057530—ISA/EPO—Oct. 12, 2009.

* cited by examiner

*Primary Examiner* — Stacy Whitmore
(74) *Attorney, Agent, or Firm* — Sam Talpalatsky; Nicholas J. Pauley; Jonathan T. Velasco

(57) ABSTRACT

A system and method of connecting a macro cell to a system power supply network is disclosed. In a particular embodiment, the method includes determining a distance of an edge of the macro cell from a power line or a ground line of the system power supply network. The method further includes selectively adding at least one line to the system power supply network.

25 Claims, 6 Drawing Sheets

SYSTEM AND METHOD OF CONNECTING A MACRO CELL TO A SYSTEM POWER SUPPLY

I. FIELD

The present disclosure is generally related to a system and method of connecting a macro cell to a system power supply.

II. DESCRIPTION OF RELATED ART

The design of a logic function on an integrated chip that specifies how the required logic elements are interconnected and specifies the physical pathways and wiring patterns between the components is a macro cell. Macro cells cover a range from a large block, such as a read only memory (ROM) section and random access memory (RAM) section, to a block of small circuit size of which various kinds of logic units are configured. Typically macro cells require their own internal power and ground sub grid to ensure sufficient power supply for proper functionalities.

Solid power and ground bus connections of macro cells's sub grid to a system power supply network implemented in an application-specific integrated circuit (ASIC)/System on Chip (SoC) design may be required to provide sufficient power to enable functionalities of the macro cells and of resulting final products including the macro cells. A widely used methodology requires alignment between the power and the ground bus of adjacent macro cells to form a continuous power and ground sub grid. The sub grid is then connected to the system power and ground grid. The internal power and ground bus (or grid) of macro cells are typically designed and fabricated to enable this methodology.

In many cases, however, especially when a circuit design contains a large number of macro cells (e.g., memory macro cells), the alignment of all macro cells is not cost efficient as it requires a time-consuming manual alignment process and may sometimes cost extra chip die area which then results in increased cost of final products. In an effort to reduce overall die area and the overall product cost, it is desirable to perform the alignment without using additional die area. In many cases, a significant number of macro cells in a circuit design could have its respective power and ground bus not being aligned. Accordingly, integrated circuit (IC) design engineers often expend extra time and effort to provide proper connection of the internal power and ground bus (or grid) of the unaligned macro cells to the system power and ground grid.

III. SUMMARY

In a particular embodiment, a method of automatically connecting a macro cell having an internal power supply network to a system power supply network is disclosed. The method includes determining a distance of an edge of the macro cell from a power line or a ground line of the system power supply network. The method further includes selectively adding at least one line to the system power supply network.

In another particular embodiment, a method of connecting an internal power supply of at least two macro cells is disclosed. The method includes detecting an edge of an internal power supply network of a first macro cell and examining a region proximate to the edge of the first macro cell for a second macro cell. The method further includes connecting an internal power supply network of the second macro cell to the internal power supply network of the first macro cell when the second macro cell is detected within the region and when the first and second macro cells are aligned with matching polarities. In addition, the method includes adding at least a second line coupled to the system power supply network when the second macro cell is not detected within the region and when the edge of the internal power supply network of the first macro cell exceeds a threshold distance from a first line of a system power supply network.

In another particular embodiment, a processor readable medium storing processor instructions is disclosed. The processor instructions are executable to cause a processor to receive data representing a circuit including a first macro cell and a system power supply network. The processor instructions are also executable to cause a processor in response to an edge of an internal power supply network of the first macro cell exceeding a threshold distance from a first line of the system power supply network, automatically adding at least one line coupled to the system power supply network and storing data representing the circuit including the at least one line.

In another particular embodiment, a processor readable medium containing circuit design data configured to be processed by a circuit fabrication system to fabricate a circuit is disclosed. The circuit design data includes an internal supply network of a first macro cell that exceeds a threshold distance from a system power supply network. The design data further includes at least one additional line coupled to the system power supply network proximate to the first macro cell and a connection between an internal power supply network of a second macro cell to the internal power supply network of the first macro cell where the first macro cell and the second macro cell are aligned with matching polarities.

One particular advantage provided by embodiments of the system and method of automatic power and ground bus connection of macro cells to a system power and ground grid of a circuit design is a reduction or elimination of the requirement of manually aligning a power and ground bus among macro cells. Another advantage provided by disclosed embodiments is increased flexibility for floor planning such that individual macro cells can be placed at locations, regardless of alignment requirements with a goal of achieving best timing closure and small die area. In addition, correct-by-construction connections of a macro cell power and ground bus to the system power and ground grid are ensured. Further, the disclosed embodiments allow improved turnaround time and repeatable results because of the automatic nature of the associated method implementation.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
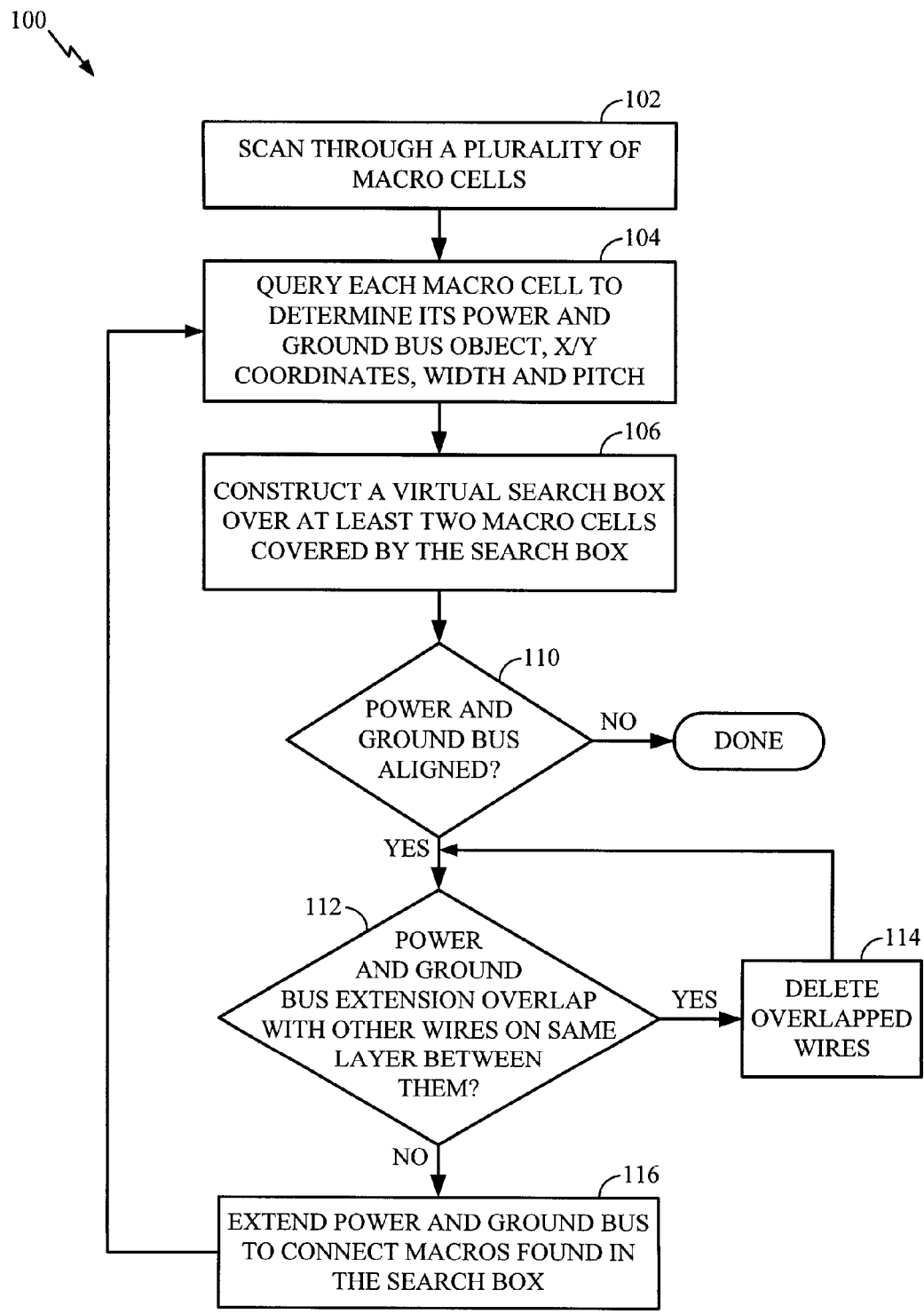
FIG. 1 is a flow diagram of a particular illustrative embodiment of a method of automatically connecting internal power supplies of adjacent macro cells.

Referring to FIG. 1, a particular illustrative embodiment of a method of automatically connecting internal power supplies of adjacent macro cells is disclosed and generally designated 100. A plurality of macro cells are scanned at 102. Continuing to 104, the power bus, x-y coordinates, width and pitch of each macro cell is determined. Moving to 106, a virtual search box is constructed over at least two macro cells covered by the search box. If the power and ground bus of the at least two macro cells covered by the search box are aligned at 110, then the method determines whether the power and ground bus extensions overlap with other wires on the same layer between the two macros, at 112. If the power and ground bus extensions overlap with other wires, then the overlapped wires are deleted, at 114. Subsequent to the determination that the power and ground bus extensions do not overlap with other wires on the same layer, the power and ground bus is extended, at 116, to connect macro cells found within the search box. The at least two macro cells may be of different sizes or types.

By automatically adding extensions to connect internal power and ground lines between aligned macros within a specified distance, the design cycle time can be reduced and integrated circuits can be designed with robust performance. An example of connecting power and ground lines of aligned macros is discussed with respect to FIG. 6.

Figure 2:
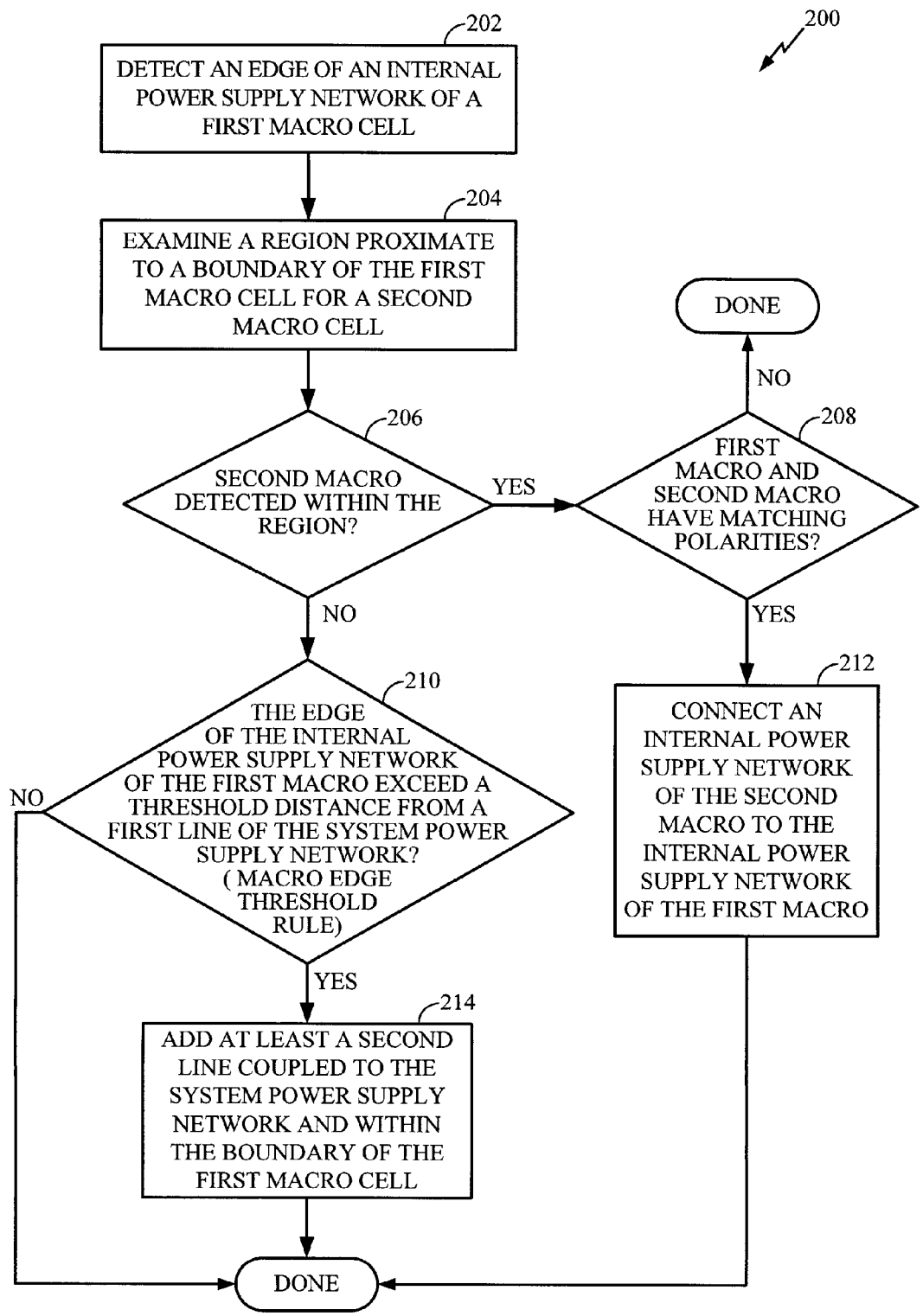
FIG. 2 is a flow diagram of a particular illustrative embodiment of a method of automatically connecting a macro cell to a system power supply network.

A particular illustrative embodiment of a method of automatically connecting macro cells to a system power supply network is illustrated in FIG. 2 and generally designated 200. The method 200 may be used during design of an integrated circuit (IC) having multiple macro cells, such as memory macro cells. The system power supply network may be within an integrated circuit that may be represented by a computer-aided circuit design data file. In addition, a data file may be generated representing a design of an electronic device that includes the system power supply network.

At 202, an edge of an internal power supply network of a first macro cell is detected. The system power supply network may be a grid of power lines and ground lines of an integrated circuit device. Advancing to 204, a region is examined to determine whether a second macro cell is proximate to the first macro cell. If a second macro cell is detected within the region at 206, then the method determines whether the internal power supply network of the first macro cell and the second macro cell have matching polarities at 208. The internal power supply of the first macro cell and the second macro cell are connected, at 212, upon determining the condition of matching polarities. If a second macro cell is not detected within the region at 206, then the method determines a distance of an edge of the first macro cell from a power line or ground line of the system power supply network and whether the distance exceeds a threshold distance from a first line of the system power supply network, at 210. The edge of the first macro cell may be an edge of the internal power supply of the first macro cell. In addition, the power line or ground line of the system power supply network may be a nearest line of the system power supply network to the edge of the internal power supply network of the first macro cell.

Figure 5:
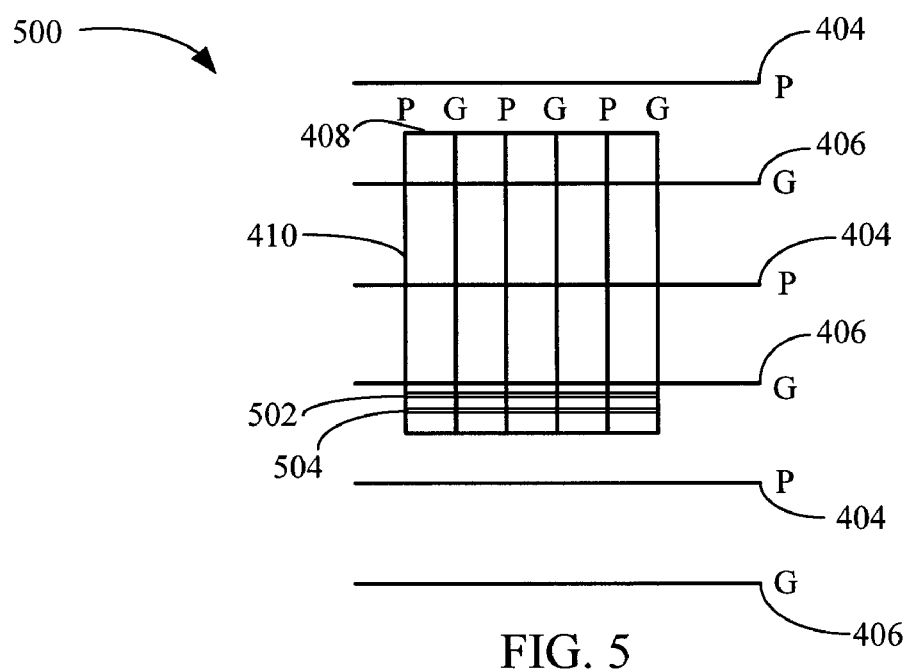
FIG. 5 is a diagram of a particular illustrative embodiment of a macro cell and system power supply network after performing the method of FIG. 2.

At least a second line may be selectively added and coupled to the system power supply network, at 214, when the threshold distance is exceeded for the macro cell power line, ground line, or any combination thereof, at 210. For example, the second line may be a metallic stripe and may be located near the boundary of the macro cell. An example of adding a second line is provided in FIG. 5, as the line 502 or 504. Further, an additional line may be added proximate to the second line and coupled to the system power supply network, such as the lines 502 and 504 as shown in FIG. 5.

The region that is examined may correspond to a maximum distance of the macro cell power line from the power line of the system power supply network as may be indicated by a design threshold rule. Similarly, a threshold rule may be established for the maximum distance of the macro cell ground line from the ground line of the system power supply network. The edge of the internal power supply network of the macro cell may be a ground line that exceeds the threshold distance from the system power supply network. Alternatively, the edge of the internal power supply network of the macro cell may be a power line that exceeds the threshold distance from the system power supply network. The performance of the integrated circuit may be increased when the threshold rule(s) is followed.

Figure 3:
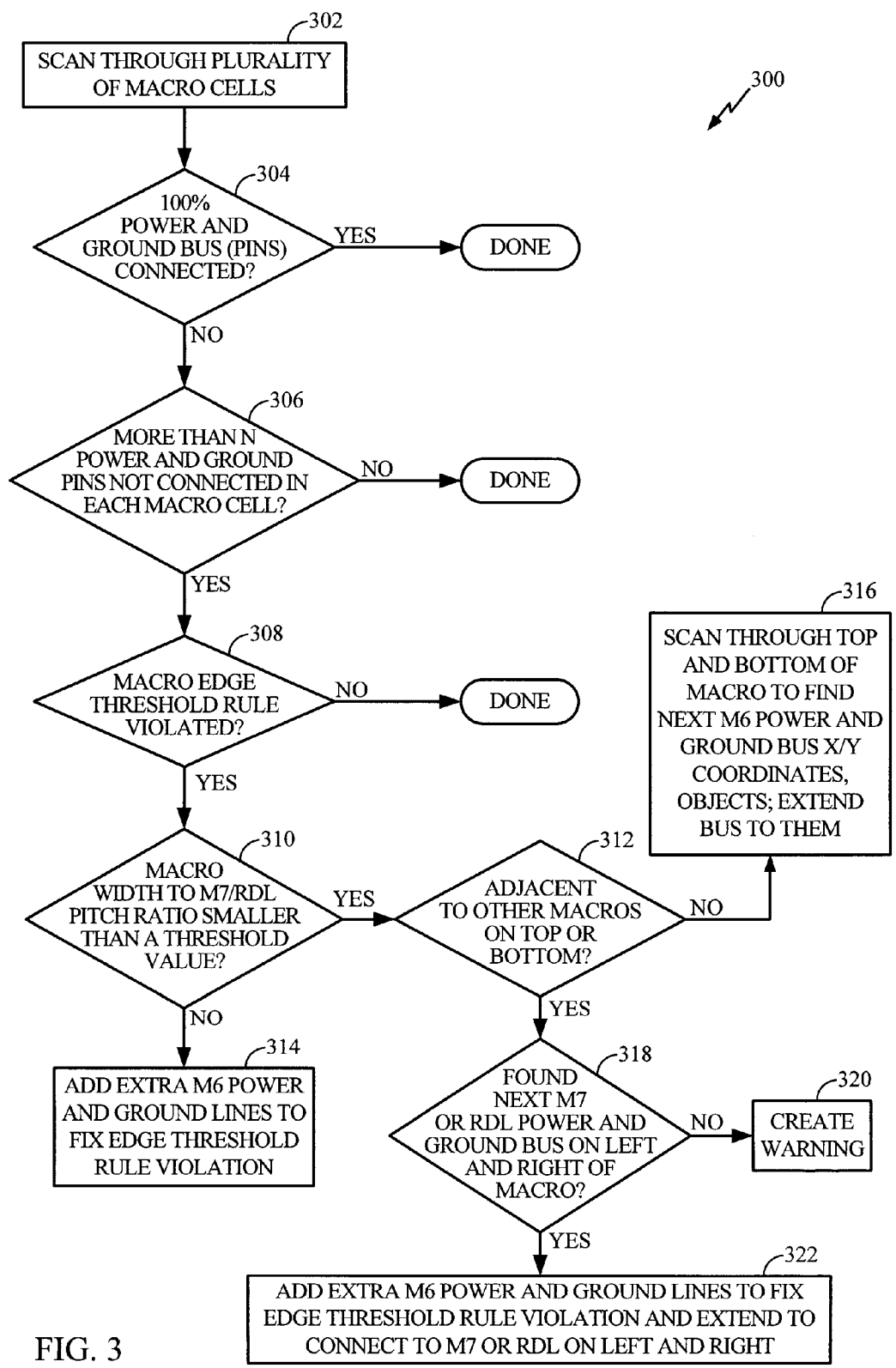
FIG. 3 is a flow diagram of a particular illustrative embodiment of a method of automatically connecting a macro cell to a system power and ground grid.

Referring to FIG. 3, a particular illustrative embodiment of a method of automatically connecting macro cells to a system power supply network is disclosed and generally designated 300. The macro cells are scanned at 302. Whether a macro cell power and ground (PG) bus is 100% connected to the system power supply network is determined at 304. If more than a certain amount (n) of PG pins (n is determined by a particular design) are not connected in a macro cell at 306, then it is determined whether a macro cell edge threshold rule is violated at 308. If a macro cell edge threshold rule is violated, then at 310 it is determined whether a PG stripe will correct the threshold rule violation.

For example, if the ratio of the macro cell width to the pitch of the vertical seventh metal layer (M7) or interconnect redistribution layer (RDL) on the integrated chip is not smaller than a threshold value, then an extra M6 horizontal PG stripe is added to correct the edge threshold rule violation, at 314. If the ratio of the macro cell width to the pitch of the M7 or RDL is smaller than the threshold, then at 312 it is determined whether the macro cell is adjacent to other macro cells on the top or bottom. The PG bus is extended to the next M6 bus through the top or bottom of the macro cell when there are no adjacent macro cells, at 316. If adjacent macro cells are located at the top or bottom of the macro cell, then at 318 it is determined whether a PG bus is found to the left and right of the macro cell. A warning is issued at 320 if the next M7 or RDL PG bus is not found to the right or left of the macro cell.

Figure 7:
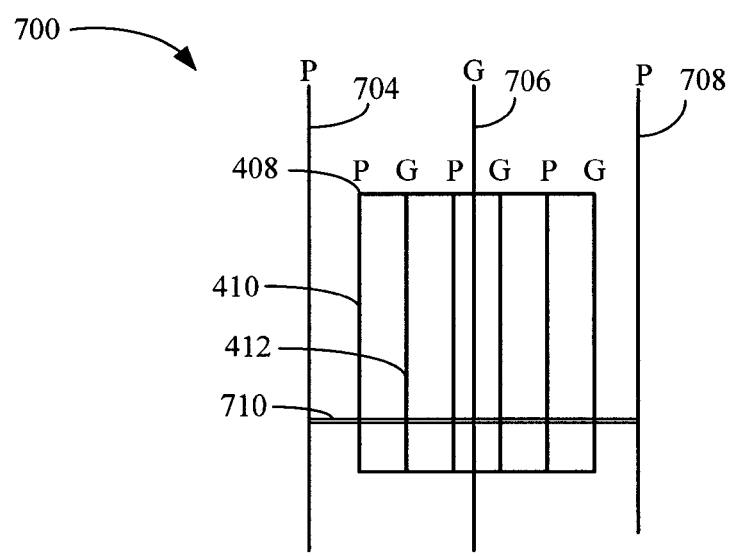
FIG. 7 is a particular illustrative embodiment of an internal power supply of a macro cell and system power supply network after performing the method of FIG. 3.

Alternatively, if a M7 or RDL PG bus is found to the left and right of the macro cell at 318, then an additional M6 stripe is added to correct the edge threshold rule violation and extends to automatically connect to the M7 or RDL on the left and right of the macro cell, as shown at 322, as illustrated in FIG. 7.

Accordingly, the alignment requirement is minimized by automatically analyzing the internal power supply network of individual macro cells and making necessary judgment calls using pre-determined threshold rules. Thus, solid connections are completed between a macro cell power and ground bus to a system power and ground grid using automated methods that can be accomplished within regular machine run time and can be repeated consistently with the same results.

Figure 4:
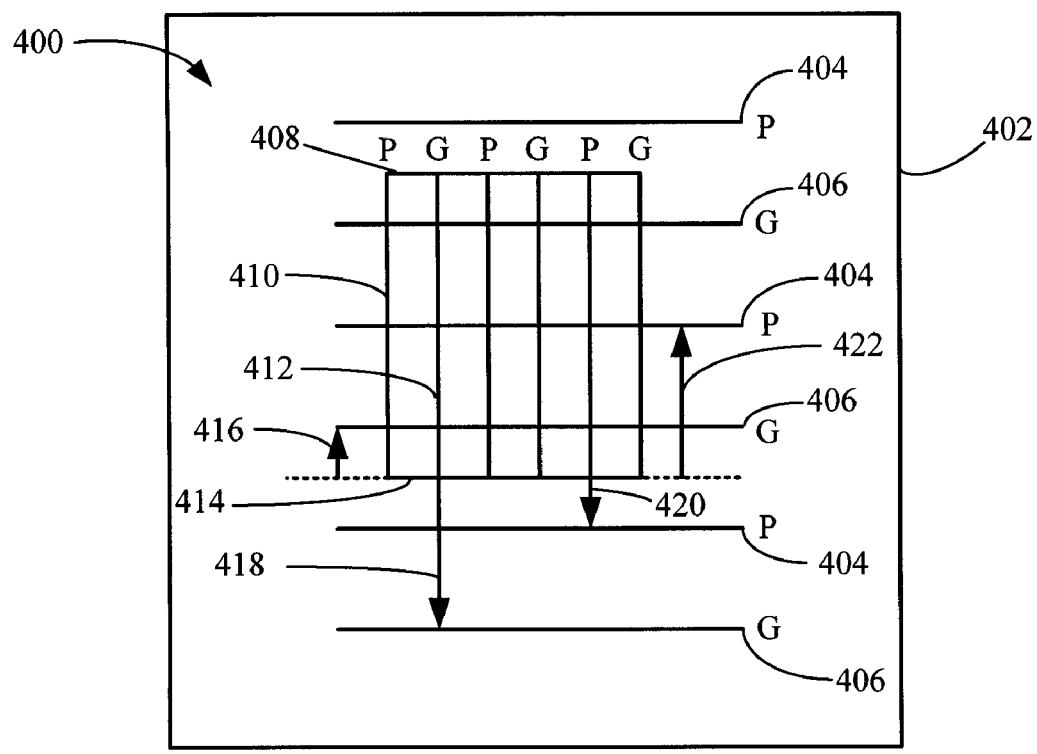
FIG. 4 is a diagram of a particular illustrative embodiment of an internal power supply network of a macro cell exceeding a threshold distance from a system power supply network.

A diagram that illustrates a particular embodiment of an internal power supply network of a macro cell exceeding a threshold distance from a system power and ground grid is disclosed in FIG. 4 and generally designated as 400. The system power supply network may be within an integrated circuit 402. The system power and ground grid includes a parallel alignment of power lines (P) 404 and ground lines (G) 406 in a lateral direction at a constant pitch. Power and ground lines of the system grid also extend in a longitudinal direction at a constant pitch to form a mesh network but are not shown for clarity. The internal supply network 408 of the macro cell is contained within a boundary of the macro cell and includes parallel alternating power 410 and ground lines 412 in a longitudinal direction. The lateral power and ground lines of the internal supply network 408 are not shown for clarity. The pitch of macro cell for those adjacent lines (i.e., wires) in a horizontal direction, as well as the pitch of those adjacent lines in a vertical direction, is determined for the connection of the respective signal terminals of the macro cell. The respective signal terminals of the macro cell are arranged at the pitch around the macro cell.

In a particular embodiment, a bottom edge 414 represents an edge of the macro that includes the internal power supply 408. In another embodiment, the bottom edge 414 may represent a bottom edge of the internal power supply 408 of the macro cell and may be a lateral power or a lateral ground line. The distance between the bottom edge 414 of the internal supply network of the macro cell when the edge is a ground line and the ground line 406 of the system power supply network within the macro cell boundary is designated 416. The distance between the bottom edge 414 and a nearest ground line of the system power supply network outside the bottom edge 414 of the macro cell boundary is designated as 418. To determine whether an edge threshold rule for the ground line of the macro cell is violated, distances 416 may be determined and compared to the maximum distance of the ground line edge threshold rule. If the distance 416 is determined to exceed the maximum distance established by a ground line edge threshold rule, then a second line coupled to the system power supply network is added within the boundary of the macro cell to correct the threshold rule violation.

Similarly, the distance between the bottom edge 414 of the macro cell and the nearest power line not within the macro cell boundary is designated 420 when the bottom edge 414 is a power line of the internal power supply network. The distance between the bottom edge 414 and the nearest power line of the system power supply network within the boundary of the macro cell is designated 422. Distance 422 may be determined and compared to the distance of the power line edge threshold rule to determine whether an edge threshold rule for the power line is violated. If the distance 422 exceeds the maximum distance established by a power line edge threshold rule, then a second power line coupled to the system power supply network is added within the boundary of the macro cell to correct the threshold rule violation.

In another embodiment, a threshold rule may be applied using edges of the macro rather than the edges of the internal power supply. For example, a threshold rule may take into account that the edge of the macro cell is proximate to the edge of the internal power supply network, according to IC design rules or convention. Although distances 416, 418, 420 and 422 are determined in a particular embodiment, in other embodiments the edge threshold rule may be checked by determining whether power or ground lines are within a region of threshold distance of the edge, without calculating the distances 416, 418, 420 and 422.

Referring to FIG. 5, a diagram of an additional ground line 502 coupled to the system power supply network that is added within the internal power supply network 408 of the macro cell when an edge threshold rule is violated is generally designated 500. An additional power line 504 coupled to the system power supply network is added within the internal power supply network 408 of the macro cell when the edge threshold rule is violated. The additional ground line 502 and the additional power line 504 may be added separately or in combination depending on whether the edge threshold rule is violated by either the ground line or power line of the internal power supply network 408 of the macro cell or by both the ground line and the power line of the internal power supply network. For example, the additional ground line 502 and the additional power line 504 may be added at 214 of FIG. 2.

Figure 6:
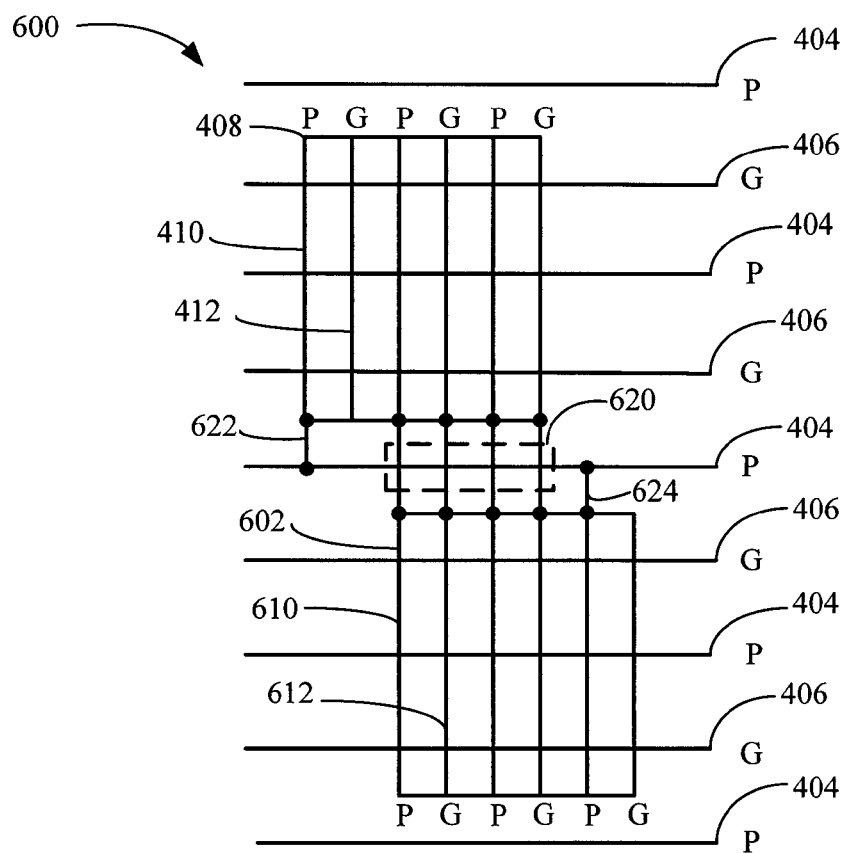
FIG. 6 is a particular illustrative embodiment of a power and ground bus of adjacent macro cells connected in accordance with the method of FIG. 1.

Referring now to FIG. 6, a diagram of a second internal power supply network 602 of a second macro cell that is oriented below a first internal power supply network 408 of a first macro cell is generally designated 600. The first and second macro cells may be of different sizes and types, such as ROM and RAM, or small circuit size of which various kinds of logic units are configured. The power and ground lines of the first and second macro cells are parallel and in a longitudinal direction. The lateral power and ground lines of the macro cells are not shown for clarity. The power lines 404 and ground lines 406 of the system power supply network are shown running in a lateral direction. The lateral power and ground lines of the system power supply network are not shown for clarity. In this embodiment, the power lines 410 of the first macro cell are aligned with the power lines 610 of the second macro cell. Similarly, the ground lines 412 of the first internal power supply network 408 are aligned with the ground lines 612 of the second internal power supply network 602. Accordingly, the first internal power supply network 408 and the second internal power supply network 602 are aligned to have matching polarities and the power and ground lines are extended, as shown at 620, to connect the first internal power supply network 408 to the second internal power supply network 602. For example, extending power and ground lines may correspond to 116 and 212 of FIGS. 1 and 2, respectively. In addition, the power lines 622, 624 may be extended to the next M6 bus through the top or bottom of the macro cell when there are no adjacent macro cells and may correspond to 316 of FIG. 3.

Referring to FIG. 7, a system power and ground grid that includes a parallel alignment of power lines and ground lines in a longitudinal direction at a constant pitch is illustrated and generally designated 700. Power (P) 704, 708 and ground (G) 706 lines of the power supply grid also extend in a lateral direction at a constant pitch to form a grid but are not shown for clarity. The internal supply network 408 of the macro cell includes parallel alternating power 410 and ground lines 412 in a longitudinal direction. The lateral power and ground lines of the internal supply network 408 are not shown for clarity. In this embodiment, the macro cell width is smaller than the M7 or RDL pitch of the system power supply network. Accordingly, an additional M6 power stripe 710 is added and extends from a first system power line 704 outside an edge of the internal power supply network 408 of the macro cell to a second system power line 708 on an opposing outside edge of the internal power supply network 408 of the macro cell. Adding the line 710 may correspond to 322 of FIG. 3.

Figure 8:
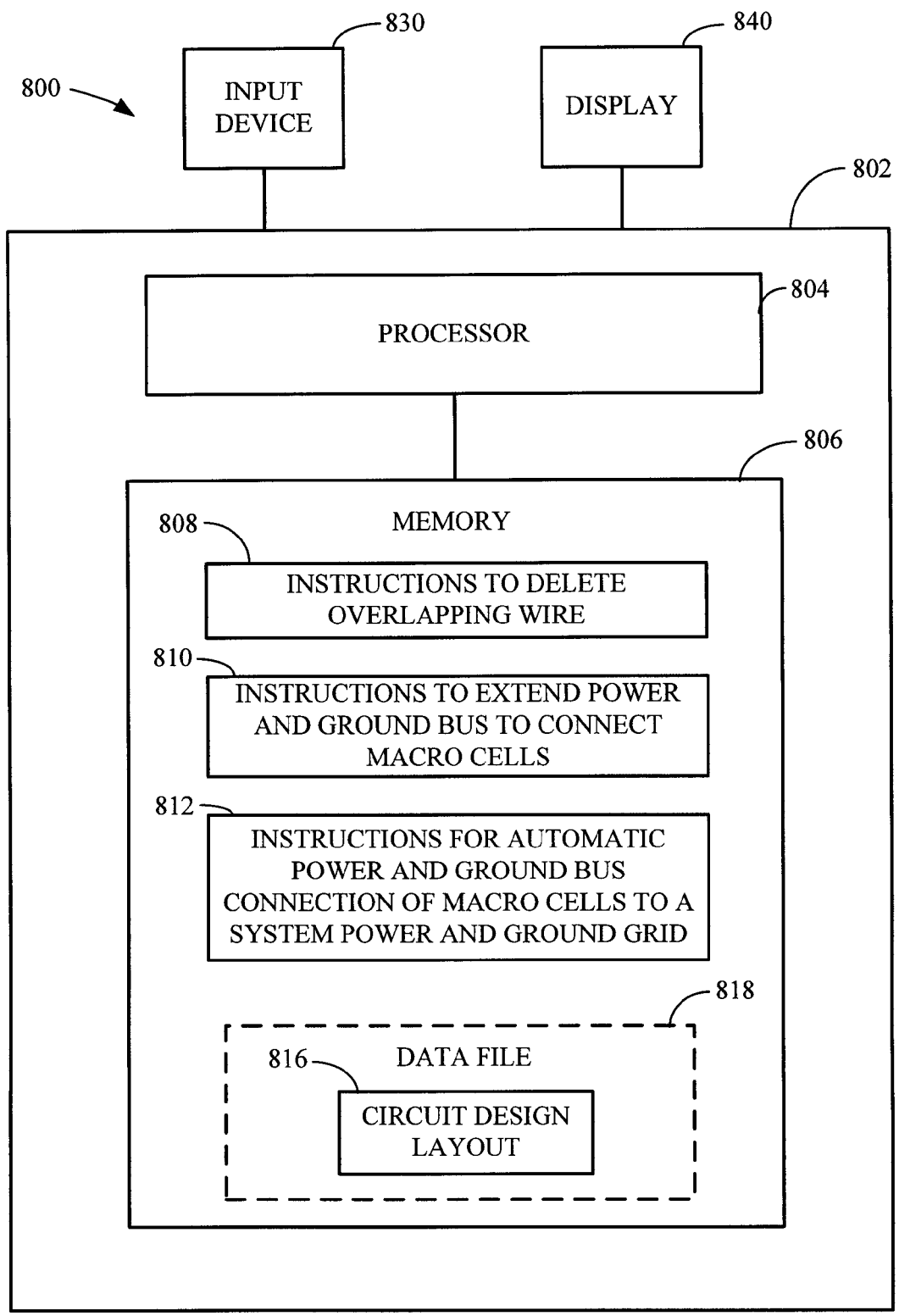
FIG. 8 is a block diagram of a particular illustrative embodiment of a system for automatically connecting a macro cell to a system power supply network.

A block diagram of a particular embodiment of a system for automatically connecting a macro cell and a system power supply grid is disclosed in FIG. 8 and generally designated 800. In a particular embodiment, the system 800 may be a physical design tool configured to perform the methods depicted in FIGS. 1-3. The system 800 includes a device 802 having at least one processor 804 and a memory 806 that is accessible to the processor 804. The memory 806 includes media that is readable by the processor 804 and that stores data and program instructions that are executable by the processor 804. For example, the processor 804 may receive data representing a circuit including a first macro cell and a system power supply network and in response to an edge of internal power supply network of the first macro cell exceeding a threshold distance from a first line of the system power supply network, automatically add at least one line coupled to the system power supply network and store data representing the circuit including the at least one line. In addition, the media may include instructions for deleting overlapping wires of adjacent macro cells 808, instructions for extending the power and ground bus to connect the internal power supplies of adjacent macro cells aligned and with matching polarities 810, instructions for automatically connecting a power and ground bus of macro cells to a system power and ground grid 812, and a data file 818 that includes a circuit design layout 816. Instructions may also include adding at least one line coupled to the system power supply network when the ratio of a width of the macro cell to a pitch of M7 or RDL is smaller than a threshold value. An input device 830 and a display 840 are coupled to the device 802. In a particular embodiment, the input device 830 may include a keyboard, a pointing device, a touch screen, a speech interface, another device to receive user input, or any combination thereof.

A processor readable medium contains the circuit design data file 818 that is configured to be processed by a circuit fabrication system to fabricate a circuit. The data file 818 includes circuit data corresponding to an internal supply network of a first macro cell that exceeds a threshold distance from a system power supply network, and at least one additional line is coupled to the system power supply network proximate to the first macro cell. The data file 818 also includes circuit data corresponding to at least one additional line that is automatically generated by a physical design tool in response to detecting the threshold distance in exceeded. The data file 818 further comprises data that represents a connection between an internal power supply network of a second macro cell to the internal power supply network of the first macro cell where the first macro cell and the second macro cell are aligned with matching polarities. The data file 818 may also include data that represents at least a second line coupled to the system power supply network when at least two busses of the second macro cell are not aligned with corresponding busses of the first macro cell and when an edge of the internal power supply network of the first macro cell exceeds a threshold distance from a first line of the system power supply network.

Although depicted as separate components, the instructions for deleting overlapping wires of adjacent macro cells 808, the instructions for extending the power and ground bus to connect the internal power supplies of adjacent macro cells 810, the instructions for the automatic connection of the power and ground bus of macro cells to a system power and ground grid 812, or any combination thereof, may be integrated into a single software package or software applications that are compatible to interoperate with each other.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   determining, at a processor, a distance of an edge of a first macro cell having an internal power supply network from a power line or a ground line of a system power supply network; and
   selectively adding at least one line to the system power supply network when the distance exceeds a threshold distance and when a second macro cell is not detected proximate to the first macro cell.

2. The method of claim 1, wherein the edge of the first macro cell is an edge of the internal power supply network.

3. The method of claim 1, wherein the edge of the first macro cell is proximate to an edge of the internal power supply network.

4. The method of claim 1, wherein the first macro cell is a memory macro cell.

5. The method of claim 1, wherein the at least one line is a power line or ground line within a boundary of the first macro cell.

6. The method of claim 1, wherein the system power supply network is within an integrated circuit.

7. The method of claim 1, further comprising generating a data file representing a design of an electronic device that includes the system power supply network.

8. The method of claim 1, wherein the at least one line is added using a physical design tool.

9. The method of claim 1, wherein the at least one line is located near a boundary of the first macro cell.

10. The method of claim 1, further comprising adding a second line proximate to the at least one line, the second line coupled to the system power supply network.

11. A method comprising:
    detecting, at a processor, an edge of an internal power supply network of a first macro cell;
    examining a region proximate to a boundary of the first macro cell for a second macro cell;
    when the second macro cell is detected within the region, connecting an internal power supply network of the second macro cell to the internal power supply network of the first macro cell when the first and second macro cells are aligned with matching polarities;
    when the second macro cell is not detected within the region and when the edge of the internal power supply network of the first macro cell exceeds a threshold distance from a first line of the system power supply network, adding at least a second line coupled to the system power supply network.

12. The method of claim 11, wherein the first line is a nearest line of the system power supply network to the edge of the internal power supply network of the first macro cell.

13. The method of claim 11, wherein the system power supply network includes a grid of power lines and ground lines of an integrated circuit device.

14. The method of claim 13, wherein the edge is a ground line in the internal power supply network of the first macro cell that exceeds a threshold distance from the system power supply network.

15. The method of claim 13, wherein the edge is a power line in the internal power supply network of the first macro cell that exceeds a threshold distance from the system power supply network.

16. The method of claim 13, wherein a power line and a ground line in the internal power supply network of the first macro cell exceed a threshold distance from the system power supply network.

17. The method of claim 11, further comprising deleting any other lines between the first macro cell and the second macro cell when overlapped with power extension lines, ground extension lines, or any combination thereof, on a same metal layer.

18. The method of claim 11, wherein the first macro cell and the second macro cell are different sizes or types.

19. A non-transitory processor readable medium comprising processor executable instructions that, when executed by a processor, cause the processor to:
    receive data representing a circuit including a first macro cell and a system power supply network;
    in response to an edge of an internal power supply network of the first macro cell exceeding a threshold distance from a first line of the system power supply network, automatically add at least a second line coupled to the system power supply network;
    delete overlapping power and round lines when the edge of the internal power supply network of the first macro cell overlaps an internal power supply network of a second macro cell; and
    store data representing the circuit including second line.

20. The non-transitory processor readable medium of claim 19, further comprising processor executable instructions that, when executed by the processor, cause the processor to:
    connect the internal power supply network of the second macro to the internal power supply network of the first macro cell when the first macro cell and second macro cell are aligned with matching polarities.

21. The non-transitory processor readable medium of claim 19, further comprising processor executable instructions that, when executed by the processor, cause the processor to:
    add at least a third line coupled to the system power supply network when a ratio of a width of the first macro cell to a pitch of a redistribution layer (RDL) is greater than or equal to a threshold ratio.

22. A non-transitory processor readable medium containing circuit design data that is configured to be processed by a circuit fabrication system to fabricate a circuit, wherein the circuit design data includes an internal supply network of a first macro cell that exceeds a threshold distance from a system power supply network, and at least one additional line is coupled to the system power supply network proximate to the first macro cell, wherein the at least one additional line is automatically generated by a physical design tool in response to detecting the threshold distance from the system power supply network is exceeded, wherein the circuit design data further comprises a connection between an internal power supply network of a second macro cell to the internal power supply network of the first macro cell where the first macro cell and the second macro cell are aligned with matching polarities; and wherein the circuit design data further includes at least a second line coupled to the system power supply network when at least two busses of the second macro cell are not aligned with corresponding busses of the first macro cell and when an edge of the internal power supply network of the first macro cell exceeds a threshold distance from a first line of the system power supply network.

23. An apparatus comprising:
    means for receiving data representing a circuit including a macro cell and a system power supply network;
    means for adding at least a first line coupled to the system power supply network based on a comparison of a threshold ratio to a ratio of a width of the macro cell to a pitch of a redistribution layer (RDL); and
    means for storing data representing the circuit including the first line.

24. The apparatus of claim 23, wherein the first line coupled to the system power supply network is added when the ratio of the width of the macro cell to the pitch of the redistribution layer (RDL) is greater than or equal to the threshold ratio.

25. The apparatus of claim 23, further comprising means for determining whether a top or a bottom of the macro cell is adjacent to at least one other macro cell when the ratio of the width of the macro cell to the pitch of the redistribution layer (RDL) is less than the threshold ratio.

* * * * *